US012389581B2

(12) United States Patent
    Yokoyama

(10) Patent No.: US 12,389,581 B2
(45) Date of Patent: Aug. 12, 2025

(54) COMPONENT STORING MEMBER STORAGE CABINET AND METHOD OF MANAGING COMPONENT STORING MEMBERS

(71) Applicant: YAMAHA HATSUDOKI KABUSHIKI KAISHA, Shizuoka (JP)

(72) Inventor: Yoshiyuki Yokoyama, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 379 days.

(21) Appl. No.: 18/249,050

(22) PCT Filed: Oct. 13, 2020

(86) PCT No.: PCT/JP2020/038619
    § 371 (c)(1),
    (2) Date: Apr. 13, 2023

(87) PCT Pub. No.: WO2022/079799
    PCT Pub. Date: Apr. 21, 2022

(65) Prior Publication Data
    US 2023/0397387 A1  Dec. 7, 2023

(51) Int. Cl.
    H05K 13/00      (2006.01)
    B65G 1/04       (2006.01)
    (Continued)

(52) U.S. Cl.
    CPC ........ H05K 13/086 (2018.08); B65G 1/0407 (2013.01); H05K 13/0084 (2013.01); H05K 13/021 (2013.01); H05K 13/0882 (2018.08)

(58) Field of Classification Search
    CPC ............ H05K 13/086; H05K 13/0084; H05K 13/0882; H05K 13/021; B65G 1/0407
    (Continued)

(56) References Cited

U.S. PATENT DOCUMENTS 5,321,885 A *  6/1994  Hino ............... B23P 21/004
                                          29/33 P
10,178,819 B2 * 1/2019 Jacobsson ........... H05K 13/086

FOREIGN PATENT DOCUMENTS

CN    101412463 A  *  4/2009 ....... H01L 21/67769
JP    2006049454 A  *  2/2006
(Continued)

OTHER PUBLICATIONS

An Office Action mailed by China National Intellectual Property Administration on Feb. 28, 2025, which corresponds to Chinese Patent Application No. 202080105987.7 and is related to U.S. Appl. No. 18/249,050; with English language translation.
(Continued)

Primary Examiner — Terrell H Matthews
(74) Attorney, Agent, or Firm — Studebaker Brackett PLLC

(57) ABSTRACT

A parts tower that stores reels storing components to be mounted on substrates includes storing sections storing the reels, loading and unloading sections in which the reels are disposed, a moving section that moves the reels inside the parts tower, an operation section receiving an instruction of unloading of the reels, and a controller. Some of the storing sections that are disposed around the loading and unloading sections are defined as unloading waiting sections. The controller performs a first moving process in which the reels that are to be unloaded relatively early among the stored reels to the unloading waiting sections are moved by the moving section before receiving the instruction of unloading the reels, and a second moving process in which the reels stored in the unloading waiting sections are moved to the loading and unloading sections by the moving section in response to receiving the instruction.

8 Claims, 9 Drawing Sheets

(51) Int. Cl.
*H05K 13/02* (2006.01)
*H05K 13/08* (2006.01)

(58) Field of Classification Search
USPC .......................................................... 414/281
See application file for complete search history.

(56) References Cited

FOREIGN PATENT DOCUMENTS

| | | | |
|---|---|---|---|
| JP | 2009-051622 | A | 3/2009 |
| JP | 2017212383 | A * | 11/2017 |
| JP | 2018164018 | A * | 10/2018 |
| JP | 6603616 | B2 * | 11/2019 |

OTHER PUBLICATIONS

International Search Report issued in PCT/JP2020/038619; mailed Dec. 15, 2020.

* cited by examiner

COMPONENT STORING MEMBER STORAGE CABINET AND METHOD OF MANAGING COMPONENT STORING MEMBERS

CROSS-REFERENCE TO RELATED APPLICATION

This application is a National Stage of International Patent Application No. PCT/JP2020/038619, filed Oct. 13, 2020, the entire content of which is incorporated herein by reference.

BACKGROUND

Technical Field

The technology described herein relates to a component storing member storage cabinet and a method of managing component storing members.

Background Art

There has been known a surface mounting device for mounting components on a substrate as described, for example, in Japanese Examined Patent Publication No. 6603616. Specifically, a component mounting device (a surface mounter) described in Japanese Examined Patent Publication No. 6603616 includes a mounting section for mounting components on a substrate and a component supply device for supplying the components to the mounting section. The mounting section includes a head unit and a head driving mechanism. The head unit includes mounting heads that suction and release electronic components. The head driving mechanism is for moving the head unit in a direction parallel to the plate surface of the substrate. The component supply device is for supplying the components stored in a tape (a component tape) and reels around which the tapes are wound are set in the component supply device. The component supply device supplies the components stored in the tape one by one to the mounting section by feeding the tape.

There has been known a component storing member storage cabinet that stores component storing members (reels around which the component tapes are wound and component trays on which the components are disposed) storing the components to be mounted on the substrate, as described, for example, in Japanese Unexamined Patent Application Publication No. 2018-164018. Specifically, the component storing member storage cabinet described in Japanese Unexamined Patent Application Publication No. 2018-164018 includes an inlet and outlet section through which the component storing members are loaded in and unloaded from the cabinet, a transfer means for transferring the stored component storing members to the inlet and outlet section, and a control section that controls the transfer means. If receiving a preparation instruction from a management computer (a component storing member management device), the control section transfers the component storing members to the inlet and outlet section.

SUMMARY

In the component storing member storage cabinet described in Japanese Examined Patent Publication No. 6603616, time required for unloading the component storing members from the storage cabinet can be shortened. In the present specification, the technology of shortening the time required for unloading the component storing members from the storage cabinet is disclosed.

(1) According to one aspect of the present disclosure, a component storing member storage cabinet that stores component storing members storing components to be mounted on substrates includes storing sections storing the component storing members, unloading sections in which the component storing members to be unloaded are disposed, a moving section configured to move the component storing members inside the component storing member storage cabinet, an instruction receiving section receiving an instruction of unloading the component storing members, and a control section. Some of the storing sections that are disposed around the unloading sections are defined as unloading waiting sections. The control section is configured to perform a first moving process and a second moving process. In the first moving process, the component storing members that are to be unloaded relatively early among the stored component storing members are moved to the unloading waiting sections by the moving section before receiving the instruction of unloading the component storing members. In the second moving process, the component storing members stored in the unloading waiting sections are moved to the unloading sections by the moving section in response to receiving the instruction of unloading the component storing members.

In the component storing member storage cabinet described in Japanese Examined Patent Publication No. 6603616, when the component storing member that is stored in a storage far from the inlet and outlet section, time required for obtaining the preparation instruction and transferring the component storing member to the inlet and outlet section becomes longer because of the long distance from the storage to the inlet and outlet section. In the component storing member storage cabinet according to the present disclosure, the storage sections around the unloading sections are defined as the unloading waiting sections. The component storing members that are to be unloaded relatively early are moved to the unloading waiting sections before receiving the instruction of unloading the component storing members. Therefore, time required for moving the component storing members that are stored in the storage sections far away from the unloading sections to the unloading sections after receiving the instruction of unloading can be shortened. According to the component storing member storage cabinet of the present disclosure, the time required for unloading the component storing members can be shortened compared to the component storing member storage cabinet of Japanese Examined Patent Publication No. 6603616.

(2) According to one aspect of the present disclosure, after moving the component storing members to the unloading sections in the second moving process, the control section may be configured to perform a third moving process of controlling the moving section to move the component storing members stored in the unloading waiting sections to be closer to the unloading sections.

According to the above component storing member storage cabinet, time required for unloading the component string members can be further shortened.

(3) According to one aspect of the present disclosure, a component storing member storage cabinet that stores component storing members storing components to be mounted on substrates includes storing sections storing the component storing members, unloading sections in which the component storing members to be unloaded are disposed, a moving section configured to move the component storing members inside the component storing member storage cabinet, an instruction receiving section receiving an instruction of unloading the component storing members, and a control section. Some of the storing sections that are disposed around the unloading sections are defined as unloading waiting sections. The control section is configured to perform a fourth moving process and a fifth moving process. In the fourth moving process, the component storing members that are to be unloaded relatively early among the stored component storing members are moved to the unloading sections by the moving section before receiving the instruction of unloading the component storing members. In the fifth moving process, the component storing members are moved to the unloading waiting sections by the moving section before receiving the instruction of unloading the component storing members, and the component storing members moved to the unloading waiting sections are to be unloaded relatively early among the component storing members except for the component storing members that are to be moved to the unloading sections in the fourth moving process.

According to the above-described component storing member storage cabinet, the component storing members that are to be unloaded earlier are moved to the unloading sections and therefore, the component storing members are already moved to the unloading sections when the instruction of unlading is received. Therefore, the time required for unloading the component storing members can be shortened. Furthermore, according to the component storing member storage cabinet, among the component storing members except for the component storing members that are to be moved to the unloading sections, the component storing members that are to be unloaded earlier are moved to the unloading waiting sections. Therefore, if receiving an instruction of unloading another component storing member right after the component storing member that is just moved to the unloading section is unloaded, the time required for moving the component storing member to the unloading section after receiving the instruction of loading can be shortened.

(4) According to one aspect of the present disclosure, after unloading the component storing members that are moved to the unloading sections, the control section may be configured to perform a sixth moving process of controlling the moving section to move the component storing members stored in the unloading waiting sections to the unloading sections and subsequently to move the component storing members stored in the unloading waiting sections to be closer to the unloading sections.

According to the component storing member storage cabinet, time required for unloading the component storing members can be further shortened.

(5) According to one aspect of the present disclosure, the control section may be configured to move the component storing members to only some of the unloading sections in the fourth moving process.

If the component storing members are moved to all the unloading sections, the component storing member that is necessary to be unloaded urgently cannot be unloaded According to the component storing member storage, the component storing members are moved only to some of the unloading sections. Therefore, other unloading sections can be used as the unloading sections for urgent use. If the component storing member is necessary to be unloaded urgently, the component storing member that is necessary to be unloaded urgently can be unloaded.

(6) One aspect of the disclosure provides a method of managing component storing members in a component storing member storage cabinet that stores the component storing members storing components that are to be mounted on substrates. The component storing member storage cabinet includes storing sections storing the component storing members, unloading sections in which the component storing members to be unloaded are disposed, a moving section configured to move the component storing members inside the component storing member storage cabinet, and an instruction receiving section receiving an instruction of unloading the component storing members, and some of the storing sections that are disposed around the unloading sections are defined as unloading waiting sections. The method includes a first moving step of moving the component storing members that are to be unloaded relatively early among the stored component storing members to the unloading waiting sections by the moving section before receiving an instruction of unloading the component storing members, and a second moving step of moving the component storing members stored in the unloading waiting sections to the unloading sections by the moving section in response to receiving the instruction of unloading the component storing members.

According to the above method, time required for unloading the component storing members can be shortened.

(7) Another aspect of the present disclosure provides a method of managing component storing members in a component storing member storage cabinet that stores the component storing members storing components that are to be mounted on substrates. The component storing member storage cabinet includes storing sections storing the component storing members, unloading sections in which the component storing members to be unloaded are disposed, a moving section configured to move the component storing members inside the component storing member storage cabinet, and an instruction receiving section receiving an instruction of unloading the component storing members, and some of the storing sections that are disposed around the unloading sections are defined as unloading waiting sections. The method includes a fourth moving step of moving the component storing members that are to be unloaded relatively early among the stored component storing members to the unloading sections by the moving section before receiving an instruction of unloading the component storing members, and a fifth moving step of moving the component storing members to the unloading waiting sections by the moving section before receiving the instruction of unloading the component storing members, the component storing members to be moved to the unloading waiting sections being to be unloaded relatively early among the component storing members except for the component storing members that are to be moved to the unloading sections in the fourth moving process.

According to the component storing member storage, time required for unloading the component storing members can be shortened. Furthermore, according to the component storing member storage, if receiving an instruction of unloading another component storing member right after the component storing member that is just moved to the unloading section is unloaded, the time required for moving the component storing member to the unloading section after receiving the instruction of loading can be shortened.

The disclosure described herein can be achieved in various forms such as a device, a method, a computer program implementing the function of the device or the method, and a medium storing the computer program.

DETAILED DESCRIPTION

First Embodiment

A first embodiment will be described with reference to FIGS. 1 to 8. In the following description, an upper-bottom direction, a front-rear direction, and a right-left direction are defined with reference to the upper-bottom direction, the front-rear direction, and the right-left direction in FIG. 4. In the following description, for components having the same configuration, some of the components may be indicated by reference signs and the rest of the components may not be indicated by the reference signs.

(1) Substrate Production System

Figure 1:
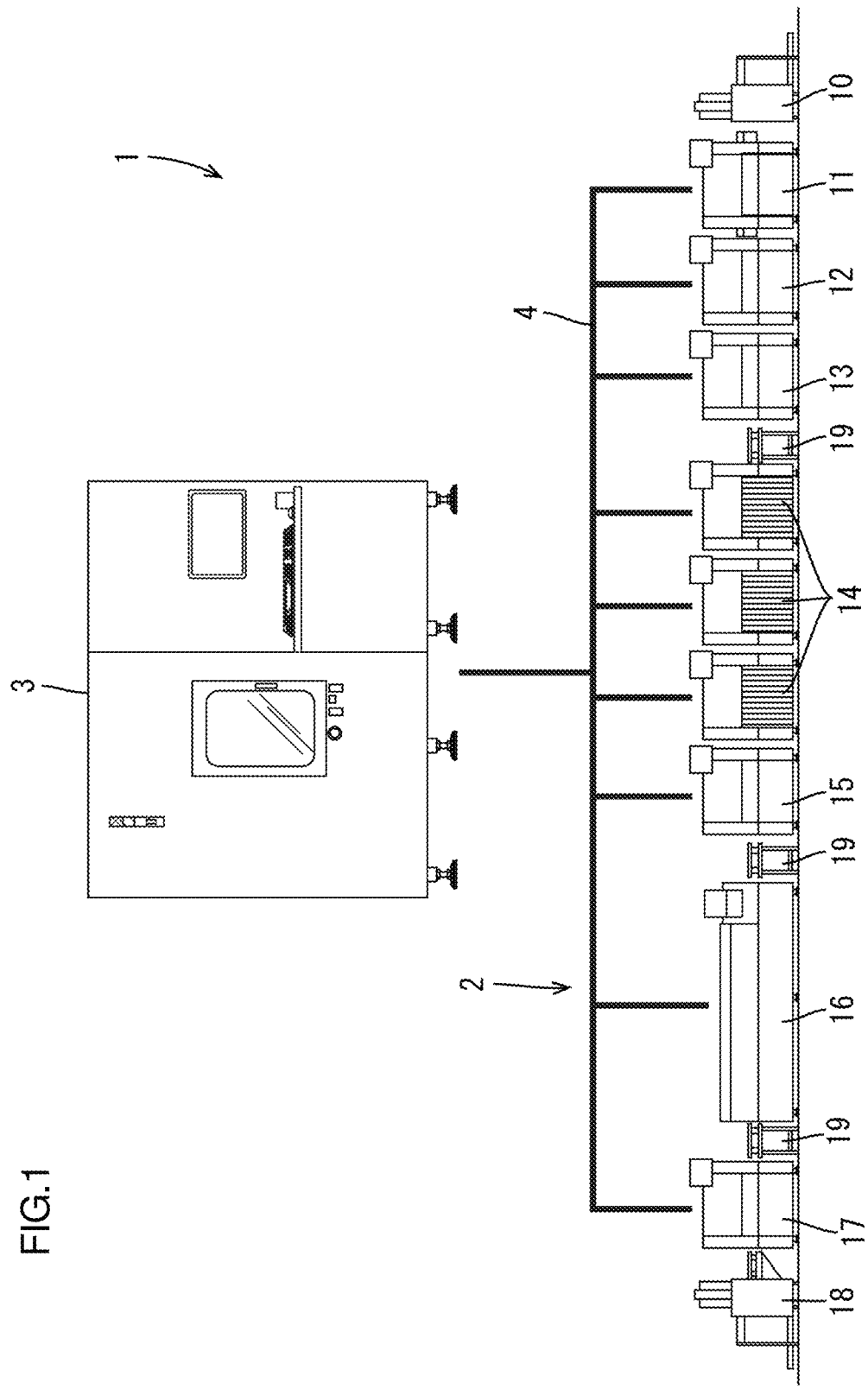
FIG. 1 is a typical view of a substrate production system according to a first embodiment.

A substrate production system 1 for mounting components on substrates will be described with reference to FIG. 1. The substrate production system 1 includes a production line 2 for mounting components on substrates and a parts tower 3 (one example of the component storing member storage cabinet). The production line 2 and the parts tower 3 are connected via a communication network 4 such as local area network (LAN) and can communicate each other.

The production line 2 includes a loader 10, a screen printer 11, a print checking machine 12, a dispenser 13, surface mounters 14, a checking machine 15 checking an outer appearance after a mounting operation, a reflow device 16, a checking machine 17 checking an outer appearance after a hardening operation, and an unloader 18 that are connected in series via conveyers 19. The surface mounter 14 includes a mounting section in which components are mounted on the substrate and a component supply device that supplies the components to the mounting section. Reels 26 (refer to FIG. 3) around which component tapes 25 (refer to FIG. 2) are wound are set in the component supply device. The reel 26 is one example of the component storing member. The component supply device includes feeding devices that electrically feed the component tapes 25. With the component tape 25 being fed by the feeding device, the components are supplied to the mounting section.

If the number of components stored in the component tape 25 becomes smaller, an operator of the substrate production system detaches the reel 26 of the component tape 25 currently used and sets a new reel 26. Then, the operator connects a tip end of a new component tape 25 to a last end of the currently used component tape 25 with an adhesive tape. The operation of connecting the tip end of the new component tape 25 to the last end of the currently used component tape 25 is generally referred to as splicing. The feeding device in which two component tapes 25 can be set may have an autoloading function. Such a feeding device automatically feeds another component tape 25 if one component tape 25 has no component.

(2) Component Tape and Reel

Figure 2:
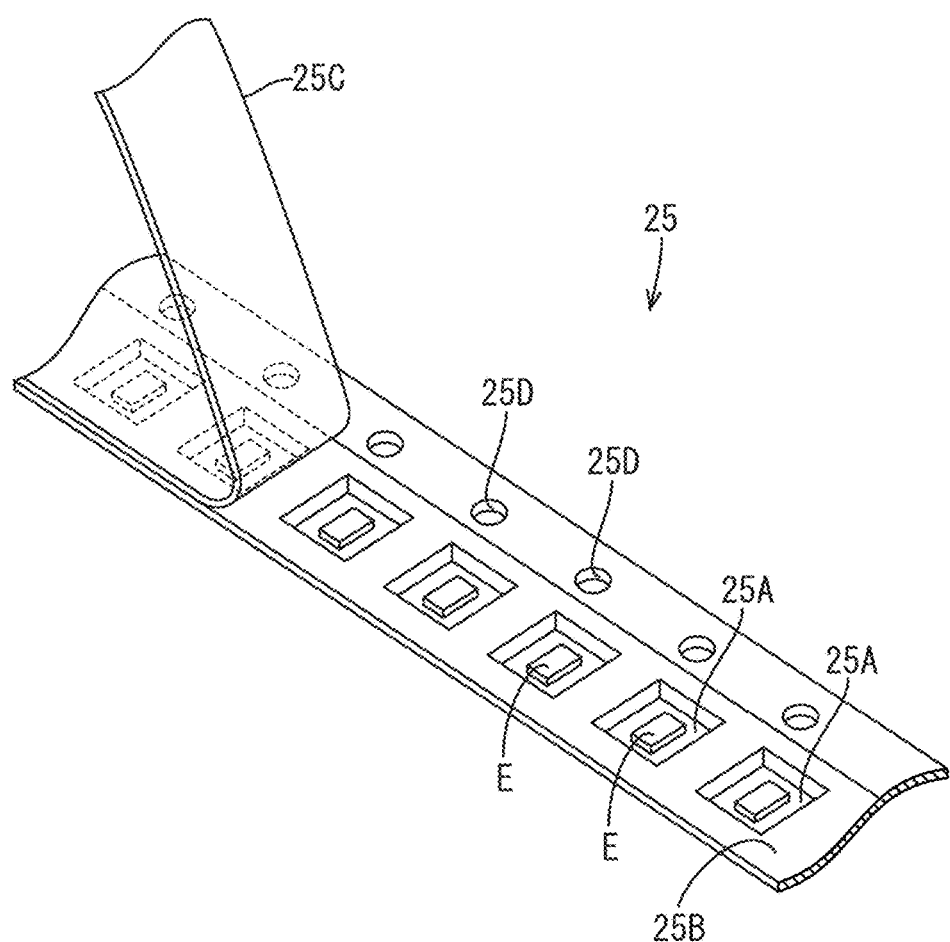
FIG. 2 is a perspective view of a component tape.

As illustrated in FIG. 2, the component tape 25 stores components E and includes a carrier tape 25B, the components E, and a top tape 25C. The carrier tape 25B includes storing recesses 25A that are arranged at equal intervals in an elongated direction. The components E are stored in the storing recesses 25A, respectively. The top tape 25C adheres to the carrier tape 25B to close the storing recesses 25A. The component E tape 25 includes holes 25D in an edge section with respect to a width direction. The holes 25D are arranged at equal intervals along the elongated direction. Teeth of a sprocket included in the feeding device of the component supply device are to be fitted in the holes 25D. Various kinds of components E are prepared and one component tape 25 stores components E of one single kind.

Figure 3:
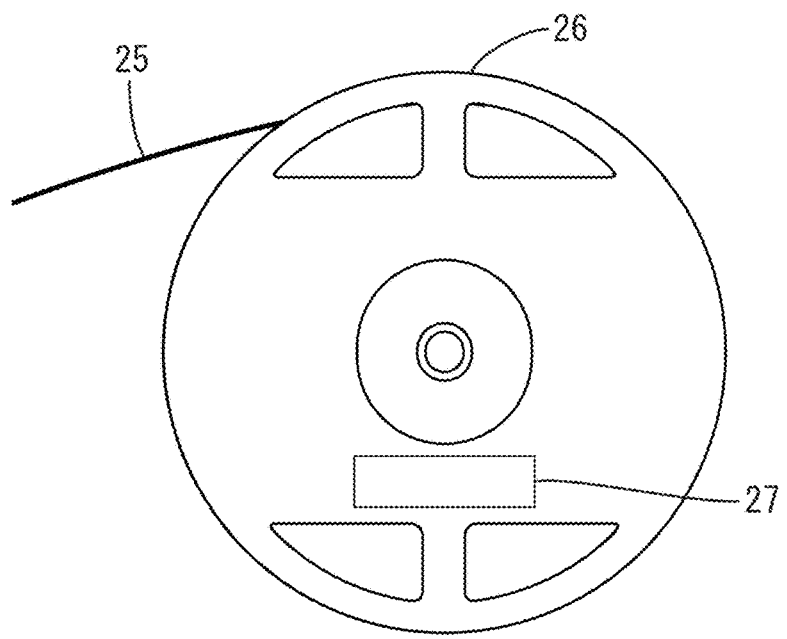
FIG. 3 is an elevation view of a reel and the component tape.

As illustrated in FIG. 3, the component tape 25 is wound around the reel 26. The reel 26 has a two-dimensional code 27 representing an identifier for identifying the reel 26 and various information (the kind and the number of components E stored in the component tape 25) related to the component tape 25 that is wound around the reel 26. The reel 26 may not have the two-dimensional code 27 but may have a bar code with which the reel 26 can be identified.

In the following description, the components E stored in the component tape 25 that is wound around the reel 26 is simply referred to as components E stored in the reel 26.

(3) Parts Tower

Figure 4:
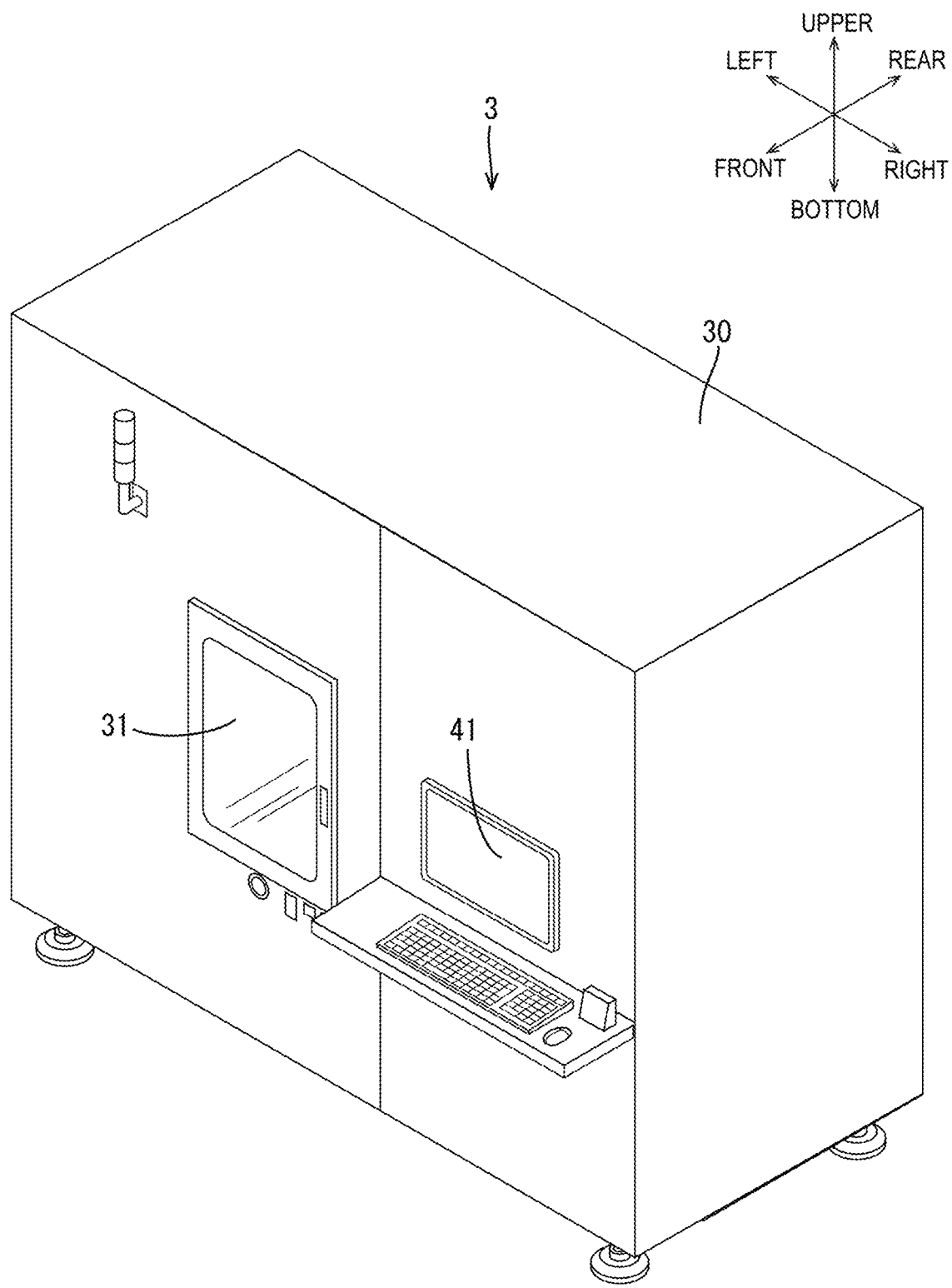
FIG. 4 is a perspective view of a parts tower.

An outer appearance of a parts tower 3 will be described with reference to FIG. 4. The parts tower 3 is a storage cabinet that stores the reels 26 including the component tapes 25. The parts tower 3 includes a cabinet body 30 of about a box shape having a lateral dimension (W) of 2600 cm, a depth (L) of 1350 cm, and a height (H) of 2500 cm. The cabinet body 30 includes a rectangular hole, which is not illustrated, in a front surface thereof. The rectangular hole is in front of a loading and unloading shelf 33 (refer to FIG. 5), which will be described later. An opening and closing door 31 with which the hole is opened and closed is rotatably connected to the cabinet body 30. The cabinet body 30 includes an operation section 41 on the front surface and on the right side of the opening and closing door 31.

An inner configuration of the parts tower 3 will be described with reference to FIGS. 5 and 6. The parts tower 3 includes storage shelves 32 (32A and 32B) storing the reels 26, the loading and unloading shelf 33 in which the reels 26 to be loaded in and unloaded from the shelf 32 are disposed, and a moving section 34 (refer to FIG. 6) that moves the reel 26 stored in the storage shelf 32 and the reel 26 placed in the loading and unloading shelf 33.

Figure 5:
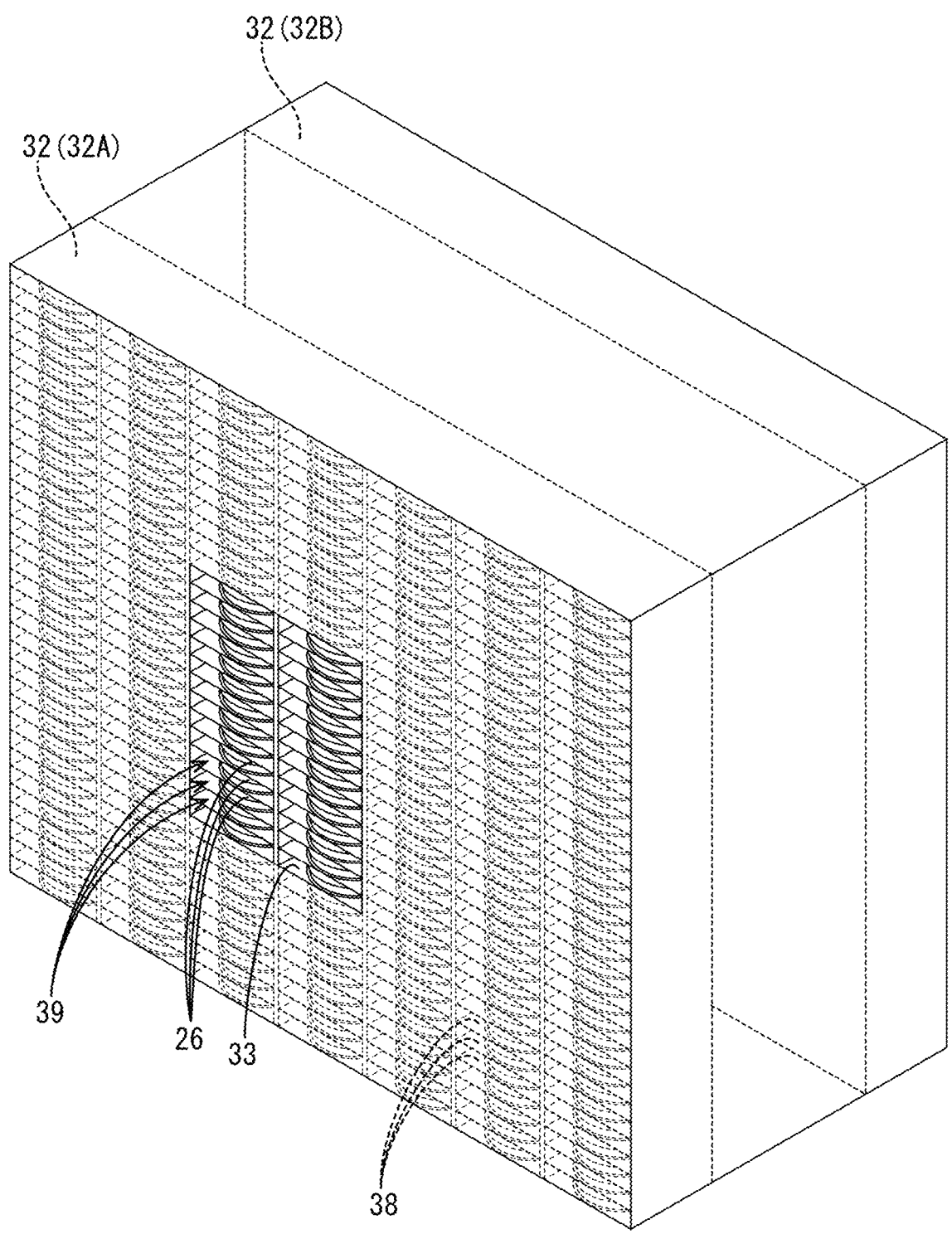
FIG. 5 is a perspective view of the inside of the parts tower.
Figure 6:
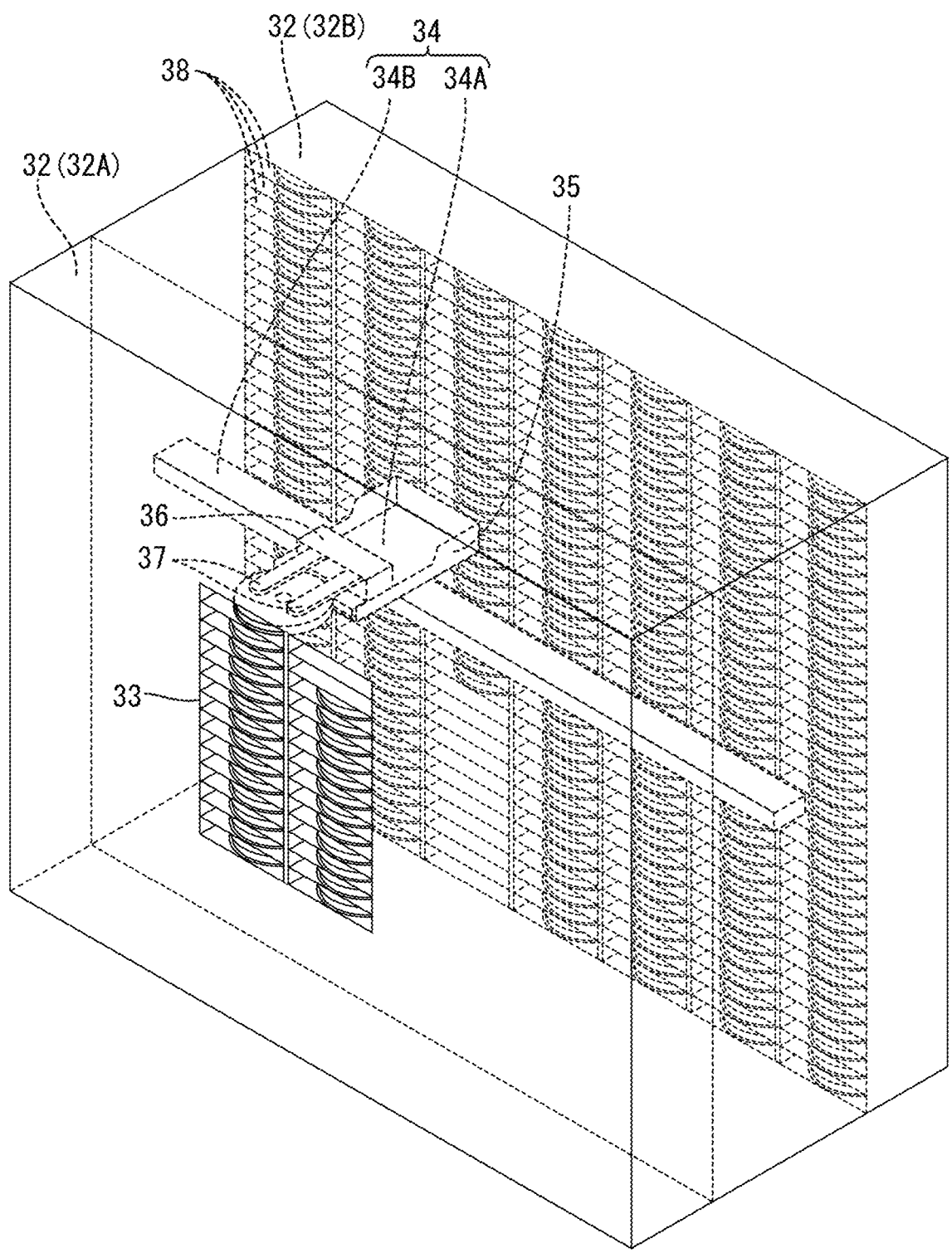
FIG. 6 is a perspective view of the inside of the parts tower (without including a front storage shelf)

As illustrated in FIGS. 5 and 6, the storage shelves 32 include a front storage shelf 32A and a rear storage shelf 32B. The rear storage shelf 32B includes thirty-four boxes in the vertical direction and seven boxes in the lateral direction. One reel 26 is stored in each of the boxes. In the following description, one box storing one reel 26 is referred to as a storage section 38. A whole configuration of the front storage shelf 32A is same as that of the rear storage shelf 32B but includes the loading and unloading shelf 33 in a middle section. The loading and unloading shelf 33 includes fourteen boxes in the vertical direction and two boxes in the lateral direction and one reel 26 can be disposed in each of the boxes. In the following description, one box of the loading and unloading shelf 33 where one reel 26 is disposed is referred to as a loading and unloading section 39. The loading and unloading section 39 is one example of an unloading section.

The moving section 34 will be described with reference to FIG. 6. The moving section 34 is a mechanism that moves the reel 26 between the loading and unloading section 39 and the storage section 38. Details will be described later. The moving section 34 moves the reel 26 between the storage sections 38. The moving section 34 includes a moving head 34A that holds the reel 26 and a head movement portion 34B that moves the moving head 34A two-dimensionally in the upper-bottom direction and the right-left direction.

The moving head 34A is configured to hold the reel 26 from upper and lower sides. The moving head 34A includes a head body 35, a holder 36 holding the reel 26, a front-rear movement mechanism, and an upper-lower movement mechanism, which are not illustrated. The holder 36 is supported by the head body 35 so as to be movable in the front-rear direction. The holder 36 includes two upper extending portions 37 and lower extending portions. The upper extending portions 37 project frontward and are arranged on an upper side of the reel 26. The lower extending portions, which are not illustrated in FIG. 6, project frontward and are arranged on a lower side of the reel 26. The head body 35 includes the front-rear movement mechanism that moves the holder 36 frontward and rearward. The holder 36 includes the upper-lower movement mechanism that moves the upper extending portions 37 up and down. The head movement portion 34B includes a movement mechanism for moving the moving head 34A in the upper-lower direction and the right-left direction and a rotation mechanism for rotating the moving head 34A around a vertical line by 180 degrees.

In the parts tower 3, the moving head 34A is moved to a target storage section 38 by the head movement portion 34B in order to unload the reel 26 from the storage section 38 by the moving head 34A. With the upper extending portions 37 of the parts tower 3 being moved upward, the holder 36 is moved frontward with the front-rear movement mechanism. After the frontward movement of the holder 36, the upper extending portions 37 are disposed above the reel 26 and the lower support portions are disposed below the reel 26. In such a state, the upper-lower movement mechanism of the parts tower 3 moves the upper extending portions 37 downward. With the upper extending portions 37 being moved downward, the reel 26 is held by the upper extending portions 37 and the lower support portions. In such a state, the front-rear movement mechanism moves the holder 36 rearward. Accordingly, the reel 26 is taken out from the storage section 38. The operation is performed in a reversed order to store the reel 26 in the storage section 38.

The moving head 34A is rotated around the vertical line by 180 degrees by the rotation mechanism of the parts tower 3 to take out the reel 26 from the rear storage shelf 32. After the rotation of the moving head 34A by 180 degrees, the operation is similar and will not be described.

(4) Electric Configuration of Parts Tower

Figure 7:
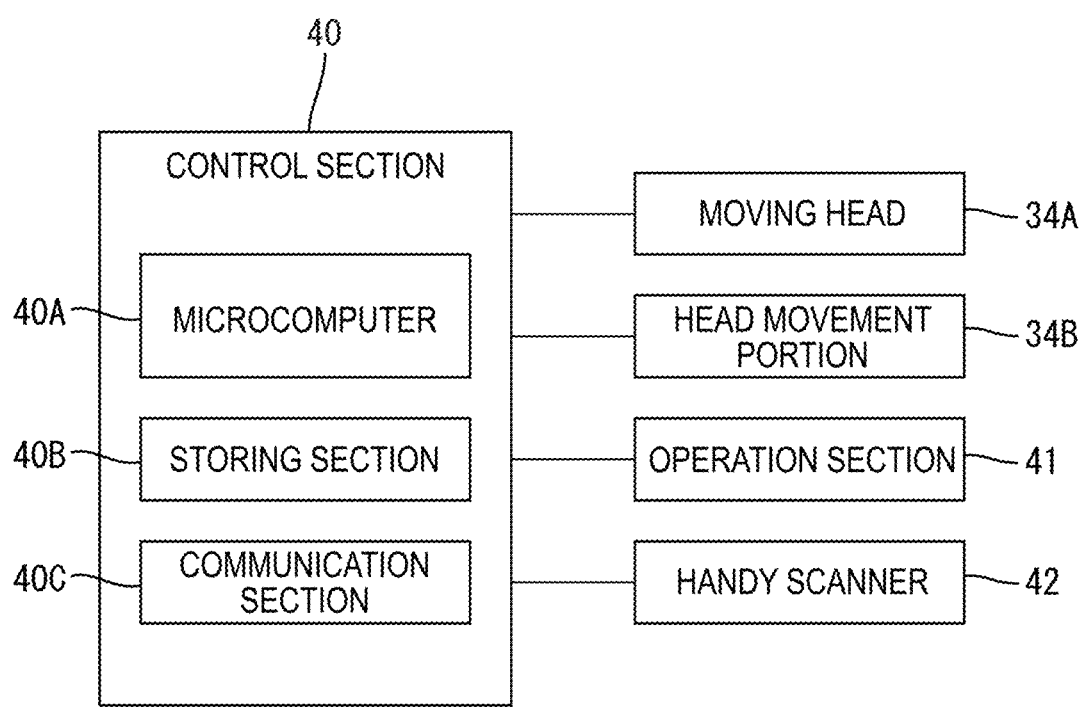
FIG. 7 is a block diagram illustrating an electric configuration of the parts tower.

An electric configuration of the parts tower 3 will be descried with reference to FIG. 7. The parts tower 3 includes a control section 40, the moving head 34A, the head movement portion 34B, the operation section 41 (one example of an instruction receiving section), and a handy scanner 42. The control section 40 includes a microcomputer 40A including a CPU and a RAM as one chip, a storing section 40B, and a communication section 40C. The storing section 40B stores various control programs and a management table for managing the reels 26 stored in the storage sections 38. The microcomputer 40A controls each section of the parts tower 3 by executing the control program stored in the storing section 40B. The communication section 40C is a communication circuit for communication between the microcomputer 40A and other devices via the communication network 4. The control section 40 may include an application specific integrated circuit (ASIC) or a field programmable gate array (FPGA) instead of the microcomputer 40A.

The operation section 41 includes a display device such as a liquid crystal display and an input device such as a keyboard, a mouse, and a touch panel. The operator instructs loading and unloading of the reels 26 by operating the operation panel. The handy scanner 42 is for scanning the two-dimensional code 27 on the reel 26. When loading the reel 26 in the parts tower 3, the operator uses the handy scanner 42 to read the two-dimensional code 27. The control section 40 obtains an identifier of the reel 26 and various information related to the component tape 25 from the two-dimensional code 27 read by the handy scanner 42. If the reel 26 that is disposed in the loading and unloading section 39 is moved to the storage section 38, the control section 40 links the identifier of the reel 26, the various information related to the component tape 25, and the storage section 38 storing the reel 26 and registers the linked information in a management table. Accordingly, the reels 26 stored in the parts tower 3 are managed.

(5) Unloading Waiting Section

Figure 8:
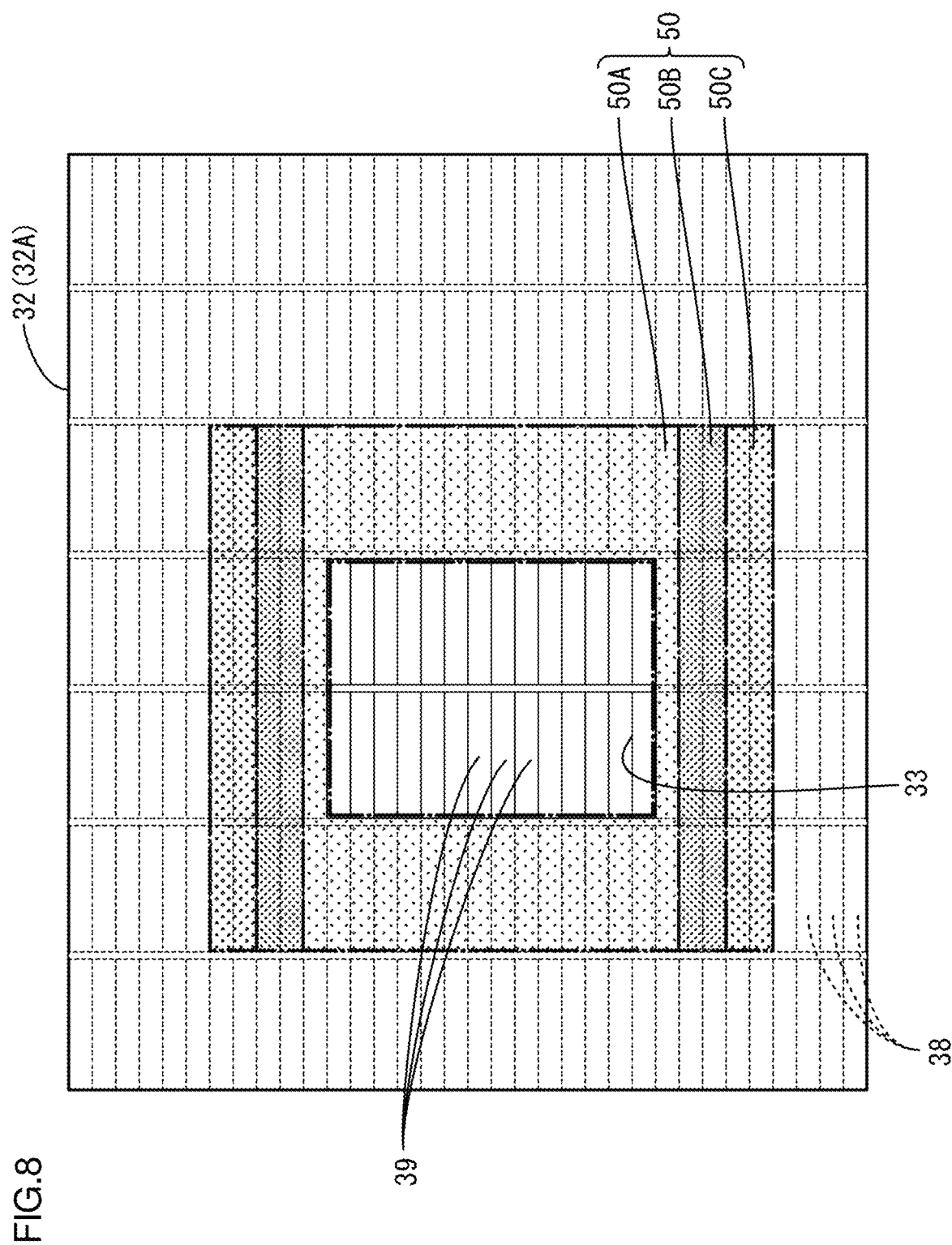
FIG. 8 is a typical view illustrating loading and unloading sections and unloading waiting sections.

Unloading waiting sections will be described with reference to FIG. 8. Some of the storage sections 38 that are disposed around the loading and unloading shelf 33 are defined as the unloading waiting sections 50. The unloading waiting sections 50 are provided for moving the reel 26 in a short time in response to the instruction of unloading the reel 26. In the configuration illustrated in FIG. 8, the unloading waiting sections 50 includes first unloading waiting sections 50A, second unloading waiting sections 50B, and third unloading waiting sections 50C. The storage sections 38 that are disposed to surround the loading and unloading sections 39 are defined as the first unloading waiting sections 50A. The storage sections 38 included in the two rows of boxes above the first unloading waiting sections 50A and the storage sections 38 included in the two rows of boxes below the first unloading waiting sections 50A are defined as the second unloading waiting sections 50B. The storage sections 38 included in the two rows of boxes above the second unloading waiting sections 50B and the storage sections 38 included in the two rows of boxes below the second unloading waiting sections 50B are defined as the third unloading waiting sections 50C. If the number of reels 26 to be stored is large, the unloading waiting sections 50 are used as the storage sections 38 (not used as the unloading waiting sections 50).

(6) Moving of Reel

Since the unloading waiting sections 50 are closer to the loading and unloading sections 39 than the storage sections 38 are, the reels 26 can be moved to the loading and unloading sections 39 in a shorter time compared to the storage sections 38. The control section 40 determines the order in which the reels 26 are unloaded based on the production planning information of the substrates, which will be described later, and the information related to the remaining number of components in each of the reels 26 that are set in the component supply device. The control section 40 moves the reels 26 that are to be unloaded relatively earlier among the reels 26 stored in the storage sections to the unloading waiting sections 50 previously before receiving the instruction of unloading.

Specifically, the control section 40 receives the production planning information and the information related to the remaining number of components from the surface mounter 14 via the communication network 4. The control section 40 may receive such information from devices other than the surface mounter 14. For example, the management computer that manages the production line 2 may be connected to the communication network 4 and manage the information. In such a system, the control section 40 may receive the information from the management computer.

The production planning information includes the type of substrates to be produced, the order in which the substrates of every type are to be produced, the number of substrates of every type to be produced, the type of components E to be mounted on the substrate of every type, and the number of components E of every type. The information related to the remaining number of components in each of the reels 26 that are set in the component supply device includes the remaining number of components in each of the reels 26.

In response to starting of production of the substrates, the control section 40 determines the number of components E of each reel 26 (each of the reels 26 set in the component supply device) to be used for producing one substrate based on the number of components E of every type that are mounted on one substrate. The control section 40 calculates the number of substrates that can be produced for each of the reels 26 that is set in the component supply device by dividing the remaining number of components in the reel 26 by the number of components E of the reel 26 necessary to be mounted on one substrate.

As the remaining number of components included in the reel 26 becomes smaller, the number of substrates that can be produced with the remaining number of components in the reel 26 is reduced. Therefore, the reel 26 including the smaller number of components with which the number of substrates to be produced is small is required to be replaced with another one first. The reel 26 including the components E of the same type of the components E included in the reel 26 with which the number of substrates to be produced is small is required to be unloaded from the storage section first. Therefore, the control section determines the order of the reels 26, which are set in the component supply device, starting from the reel 26 including the smallest number of components, with which the number of substrates to be produced is smallest. The control section 40 determines the order in which the components E of every type are unloaded based on the type of components E in each reel 26. The control section 40 determines the order in which the reels 26 are unloaded according to the order in which the components E of every type are to be unloaded.

For example, among the reels 26 set in the component supply device, the components E in the reel 26 with which the number of substrates to be produced is smallest are components of type A, the components E in the reel 26 with which the number of substrates to be produced is second smallest are components of type B, and the components E in the reel 26 with which the number of substrates to be produced is third smallest are components of type C. In such a case, the control section 40 determines to unload the reel 26 storing the components E of type A, the reel 26 storing the components E of type B, and the reel 26 storing the components E of type C in this order. In the following description, the reel 26 that is to be unloaded first is referred to as a reel 26 having high priority.

After determining the order in which the reels 26 are unloaded (namely, the priority of the reels 26), the control section 40 moves the reel 26 having high priority from the storage section 38 where the reel 26 is stored to the unloading waiting section 50 (an example of a first moving process and a first moving step). In the following, the operation will be specifically described. In the following description, the unloading waiting sections are empty at first for easy understanding.

The control section 40 controls the moving head 34A and the head movement portion 34B to move the reels 26 stored in the storage sections 38 to the unloading waiting sections 50A sequentially from the reel 26 having highest priority. For example, when moving one reel 26 storing the components E of type A to the first unloading waiting section in a configuration including multiple reels 26 storing the components E of type A, any one of the reels 26 storing the components E of type A may be moved to the first unloading waiting section 50A. If the order in which the reels 26 are unloaded is previously determined in the configuration including multiple reels 26 storing the components E of type A, one of the reels 26 having the earliest order may be moved to the first unloading waiting section 50A. For example, one of the reels 26 storing the components E that are used for products of earlier production time may be unloaded first. In such a case, one of the reels 26 storing the components E of type A that are used for products of earlier production time may be moved to the first unloading waiting section 50A.

If determining that the first unloading waiting sections 50A are full, the control section 40 moves the reels 26 stored in the storage sections 38 to the second unloading waiting sections 50B sequentially from the reel 26 having highest priority. If determining that the second unloading waiting sections 50B are full, the control section 40 moves the reels 26 stored in the storage sections 38 to the third unloading waiting sections 50C sequentially from the reel 26 having highest priority. If determining that the third unloading waiting sections are full, the control section 40 temporally stops moving the reels 26.

If determining that the remaining number of components in any one of the reels 26 is a predefined number or less, the surface mounter 14 informs an operator to set a new reel 26. The surface mounter 14 informs the control section 40 of the parts tower 3 of the type of components E stored in the reel 26 whose remaining number is the predetermined number or less. If the operator is informed of replacement of the reel 26, the operator moves to the parts tower 3 and operates the operation section 41 to instruct unloading of the reel 26. If receiving the instruction of the unloading, the control section 40 moves the reel 26 storing the components E of the type, which is informed by the surface mounter 14, from the unloading waiting section 50 to the loading and unloading shelf 33 (an example of a second moving process and a second moving step).

After moving the reel 26 stored in the unloading waiting section 50 to the loading and unloading shelf 33, the control section 40 moves the reels 26 among the unloading waiting sections 50 to be closer to the loading and unloading shelf 33. Specifically, if determining that the reel 26 stored in the first unloading waiting section 50A is unloaded and one of the first unloading waiting sections 50A becomes empty, the control section 40 moves one of the reels 26 having the highest priority in the second unloading waiting sections SOB to the empty first unloading waiting section 50A. Similarly, if determining that one of the second unloading waiting sections SOB becomes empty, the control section 40 moves one of the reels 26 having the highest priority in the third unloading waiting sections 50C to the empty second unloading waiting section SOB.

If determining that one of the third unloading waiting sections 50C is empty, the control section 40 moves one of the reels 26 in the storage sections 38 (the storage sections 38 other than the unloading waiting sections 50) having the highest priority to the empty third unloading waiting section 50C (one example of a third moving process). If determining that the third unloading waiting sections 50C are full, the control section 40 temporally stops moving the reels 26.

(5) Effects of the Embodiment

In the parts tower 3 according to the first embodiment, the component tapes 25 that are to be unloaded relatively early are moved to the unloading waiting sections 50 before the instruction of unloading the component tapes 25. Therefore, the time required for moving the component tapes 25 that are stored in the storage sections 38 far away from the loading and unloading shelf 33 to the loading and unloading shelf 33 after receiving the instruction of unloading can be shortened. According to the storage cabinet of storing the component tapes 25, the time required for unloading the component tapes 25 can be shortened.

According to the parts tower 3, after moving the component tape 25 to the loading and unloading shelf 33 in the second moving process, the moving section 34 is controlled to perform the third moving process and move the component tape 25 that is stored in one unloading waiting section of the unloading waiting sections 50 to another one of the unloading waiting sections 50 that is closer to the loading and unloading shelf 33 than the one unloading waiting sections 50 is. This shortens the time required for unloading the component tape 25.

Second Embodiment

Next, a second embodiment will be described with reference to FIG. 8. In the first embodiment, the reel 26 having high priority is moved to the unloading waiting section 50. In the second embodiment, the control section 40 moves the reels 26 having high priority to the loading and unloading shelf 33 and the unloading waiting sections 50.

Specifically, the control section 40 controls the moving head 34A and the head movement portion 34B to move the reels 26 stored in the storage sections 38 to the loading and unloading shelf 33 sequentially from the one having highest priority (an example of a fourth moving process and a fourth moving step). If determining that the loading and unloading shelf 33 is full, the control section 40 moves the reels 26 stored in the storage sections 38 to the first unloading waiting sections 50A sequentially from the reel 26 having highest priority. If determining that the first unloading waiting sections 50A are full, the control section 40 moves the reels stored in the storage sections 38 to the second unloading waiting sections 50B sequentially from the reel 26 having highest priority. If determining that the second unloading waiting sections 50B are full, the control section 40 moves the reels 26 stored in the storage sections 38 to the third unloading waiting sections 50C sequentially from the reel 26 having highest priority (one example of a fifth moving process and a fifth moving step). If determining that the third unloading waiting sections 50C are full, the control section 40 temporally stops moving the reels 26.

If the reels 26 that are moved to the loading and unloading shelf 33 are unloaded from the loading and unloading shelf 33, the control section 40 moves the reels 26 stored in the first unloading waiting sections 50A to the loading and unloading shelf 33 sequentially from the one having highest priority. If determining that the loading and unloading shelf 33 is full, the control section 40 moves the reels 26 among the unloading waiting sections 50 to be closer to the loading and unloading shelf 33. Specifically, if determining that the reel 26 stored in the first unloading waiting section 50A is moved out to the loading and unloading shelf 33 and one of the first unloading waiting sections 50A becomes empty, the control section 40 moves one of the reels 26 having the highest priority in the second unloading waiting sections 50B to the empty first unloading waiting section 50A. Similarly, if determining that one of the second unloading waiting sections 50B becomes empty, the control section 40 moves one of the reels 26 having the highest priority in the third unloading waiting sections 50C to the empty second unloading waiting section 50B. If determining that one of the third unloading waiting sections 50C is empty, the control section 40 moves one of the reels 26 in the storage sections 38 (the storage sections 38 other than the unloading waiting sections 50) having the highest priority to the empty third unloading waiting section 50C (one example of a sixth moving process). If determining that the third unloading waiting sections 50C are full, the control section 40 temporally stops moving the reels 26. According to the parts tower 3 of the second embodiment, the reels 26 that are to be unloaded earlier are moved to the loading and unloading shelf 33 and therefore, the reel 26 is already moved to the loading and unloading shelf 33 when the instruction of unlading is received. Therefore, the time required for unloading the reels 26 can be shortened. Furthermore, according to the parts tower 3, among the reels 26 except for the reels 26 that are to be moved to the loading and unloading shelf 33, the reels 26 that are to be unloaded earlier are moved to the unloading waiting sections 50. Therefore, if receiving an instruction of unloading another reel 26 right after the reel 26 that is just moved to the loading and unloading shelf 33 is unloaded, the time required for moving the reel 26 to the loading and unloading shelf 33 after receiving the instruction of loading can be shortened.

According to the parts tower 3, after the reel 26 that is moved to the loading and unloading shelf 33 is unloaded, the moving section 34 is controlled to move the reel 26 stored in the unloading waiting section 50 to the loading and unloading shelf 33. Then, the reel 26 stored in the unloading waiting section 50 is moved to another unloading waiting section 50 that is closer to the loading and unloading shelf 33. Therefore, the time required for unloading the reel 26 can be shortened.

Third Embodiment

Figure 9:
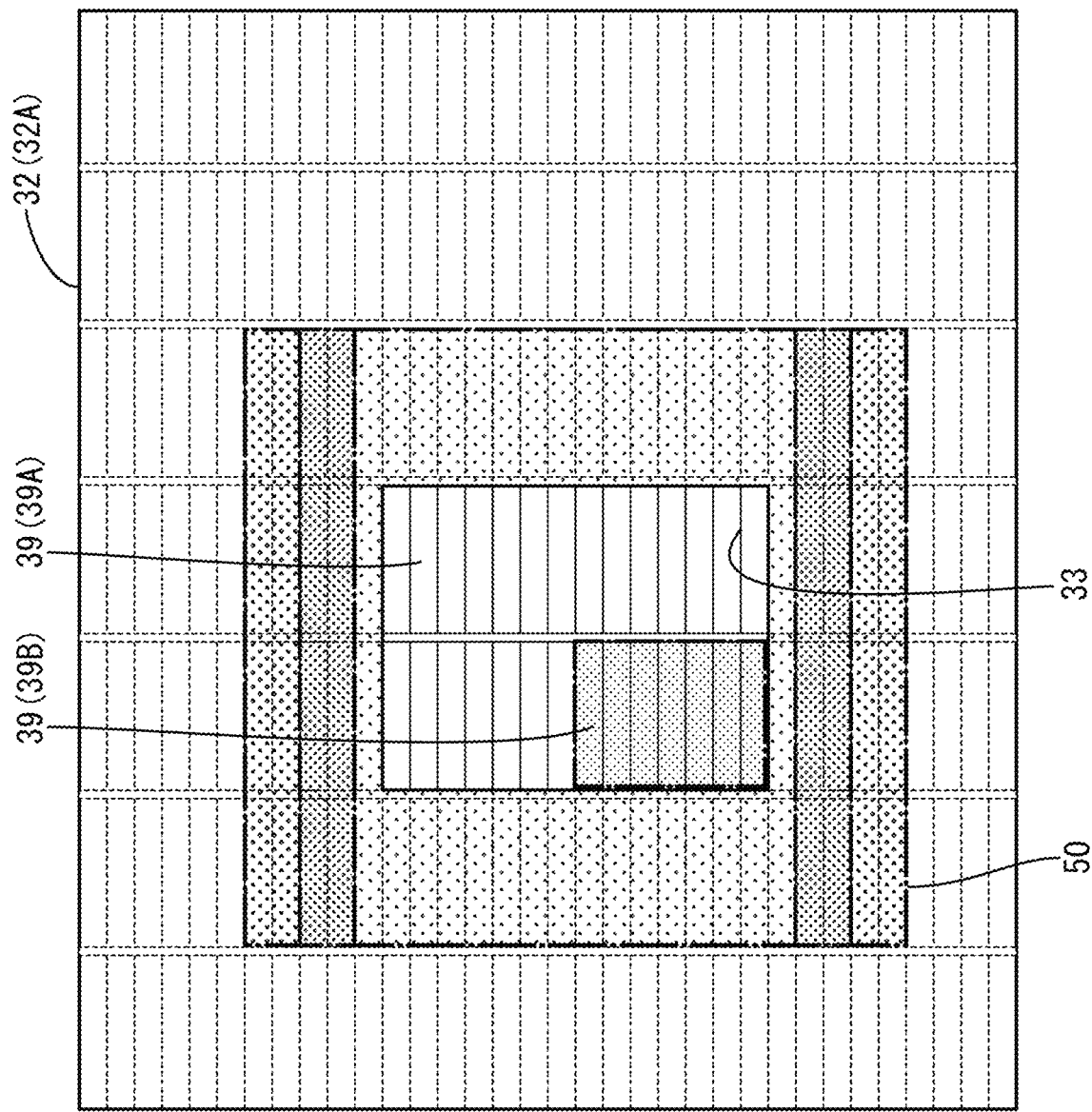
FIG. 9 is a typical view illustrating loading and unloading sections and unloading waiting sections according to a third embodiment.

Next, a third embodiment will be described with reference to FIG. 9. The third embodiment is a modification of the second embodiment. In the second embodiment, the reels 26 having high priority are moved to the loading and unloading shelf 33 until the loading and unloading shelf 33 becomes full. As illustrated in FIG. 9, in the parts tower 3 according to the third embodiment, some of the loading and unloading sections 39 of the loading and unloading shelf 33 are defined as the loading and unloading sections 39 for urgent use.

When moving the reels 26 having high priority to the loading and unloading shelf 33, the control section 40 moves the reels 26 to loading and unloading sections 39A other than the loading and unloading sections 39 for urgent use and does not move the reels 26 to the loading and unloading sections 39 for urgent use.

According to the parts tower 3 of the third embodiment, in the fourth moving process of moving the reels 26 that are to be unloaded early to the loading and unloading shelf 33, the reels 26 are moved only to some of the loading and unloading sections 39 (the loading and unloading sections 39A). Therefore, other loading and unloading sections 39 (the loading and unloading sections 39B) can be used as the loading and unloading sections 39 for urgent use. If the reel 26 is necessary to be unloaded urgently, the reel 26 that is necessary to be unloaded urgently can be unloaded.

Other Embodiments

The technology described herein is not limited to the embodiments described in the above description and the drawings. The following embodiments may be included in the technical scope of the technology described herein, for example.

(1) In the above embodiments, the unloading waiting sections 50 include the first unloading waiting sections 50A, the second unloading waiting sections 50B, and the third unloading waiting sections 50C. The unloading waiting sections 50 may include only the first unloading waiting sections 50A.

(2) In the above embodiments, if the substrates are started to be produced, the order in which the reels 26 are to be unloaded is determined and the reels 26 are moved. However, the timing of moving the reels 26 is not limited to the timing of the above embodiments. For example, the reels 26 may be moved before starting the production of substrates. By connecting a new component tape 25 to the last end of the currently used component tape 25 with splicing, the remaining number of components varies. Therefore, every time a new component tape 25 is connected with splicing, the order in which the reels 26 are to be unloaded may be determined and the reels 26 may be moved.

(3) In the above embodiments, the control section 40 determines the order, in which the reels 26 are to be unloaded, based on the production planning information and the information related to the remaining number of components. The surface mounter 14 or an external management computer may determine the order in which the reels 26 are to be unloaded and inform the control section 40 of the order.

(4) In the above embodiments, the unloading waiting sections 50 are included only in the front storage shelf 32A out of the front storage shelf 32A and the rear storage shelf 32B. However, the rear storage shelf 32B may also include the unloading waiting sections 50. For example, the storage sections 38 of the rear storage shelf 32B that are disposed to overlap the loading and unloading shelf 33 seen from the front side may be defined as the unloading waiting sections 50. The front storage shelf 32A may not include the unloading waiting sections 50 and only the rear storage shelf 32B may include the unloading waiting sections 50.

Figure 10:
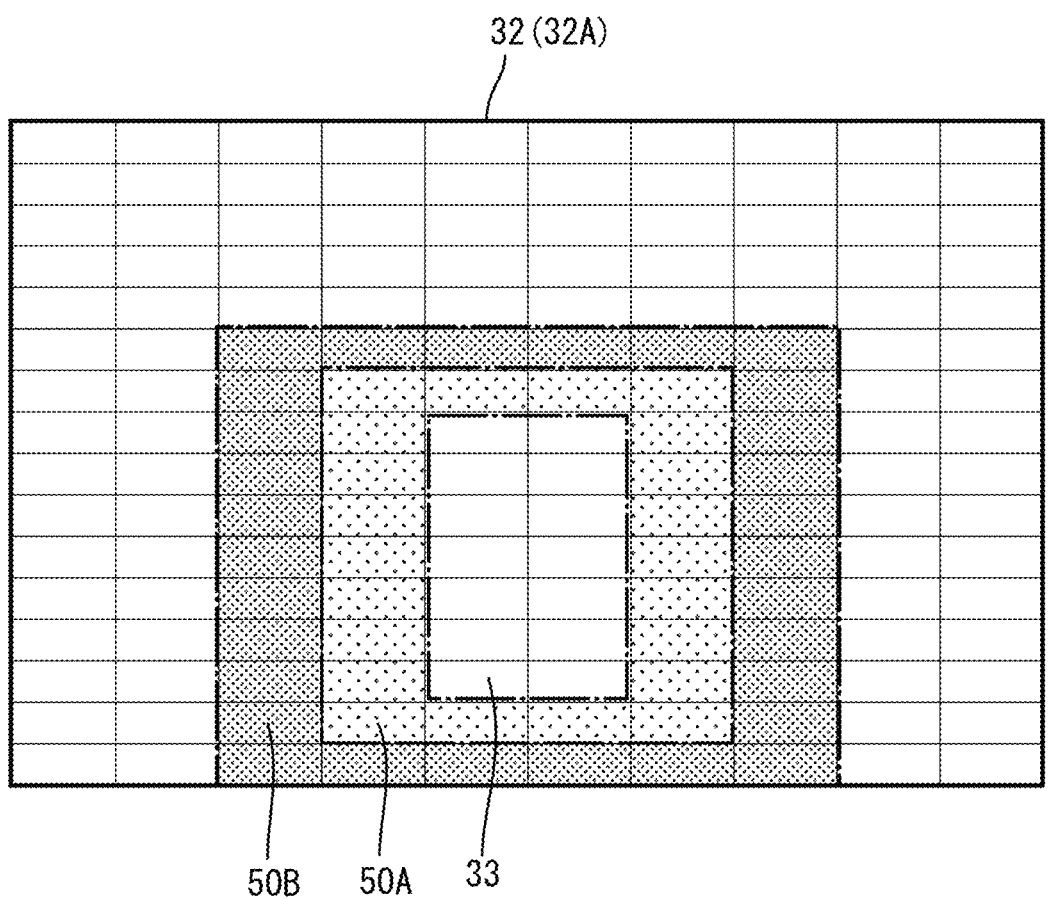
FIG. 10 is a typical view illustrating loading and unloading sections and unloading waiting sections according to another embodiment.

(5) In the above embodiments, the first unloading waiting sections 50A are disposed to surround the loading and unloading shelf 33, and the second unloading waiting sections 50B and the third unloading waiting sections 50C are disposed on upper and lower sides of the loading and unloading shelf 33. As illustrated in FIG. 10, the second unloading waiting sections 50B may be disposed surround the loading and unloading shelf 33. Further, the second unloading waiting sections 50B and the third unloading waiting sections 50C may be disposed to surround the loading and unloading shelf 33.

(6) In the above embodiments, the reel 26 is described as an example of the component storing member. However, the component storing member may be a component tray on which components are disposed.

What is claimed is:

1. A component storing member storage cabinet that stores component storing members storing components to be mounted on substrates, the component storing member storage cabinet comprising:
   storing sections storing the component storing members;
   unloading sections in which the component storing members to be unloaded are disposed;
   unloading waiting sections that are some of the storing sections disposed around the unloading sections and in which the component storing members are disposed;
   a moving section configured to move the component storing members inside the component storing member storage cabinet;
   an instruction receiving section receiving an instruction of unloading the component storing members; and
   a control section configured to
      control the moving section to move the component storing members that are to be unloaded early among the component storing members stored in the storing sections to the unloading waiting sections before receiving the instruction of unloading the component storing members, and
      control the moving section to move the component storing members stored in the unloading waiting sections to the unloading sections in response to receiving the instruction of unloading the component storing members.

2. The component storing member storage cabinet according to claim 1, wherein
   after moving the component storing members from the unloading waiting sections to the unloading sections, the control section is configured to control the moving section to move the component storing members stored in the unloading waiting sections to be closer to the unloading sections.

3. A component storing member storage cabinet that stores component storing members storing components to be mounted on substrates, the component storing member storage cabinet comprising:
- storing sections storing the component storing members;
- unloading sections in which the component storing members to be unloaded are disposed;
- unloading waiting sections that are some of the storing sections disposed around the unloading sections and in which the component storing members are disposed;
- a moving section configured to move the component storing members inside the component storing member storage cabinet;
- an instruction receiving section receiving an instruction of unloading the component storing members; and
- a control section configured to
  - control the moving section to move the component storing members that are to be unloaded early among the component storing members stored in the storing sections to the unloading sections before receiving the instruction of unloading the component storing members, and
  - control the moving section to move the component storing members to the unloading waiting sections before receiving the instruction of unloading the component storing members, the component storing members being moved to the unloading waiting sections being to be unloaded early among the component storing members except for the component storing members that are moved to the unloading sections.

4. The component storing member storage cabinet according to claim 3, wherein
after unloading the component storing members that are disposed in the unloading sections, the control section is configured to control the moving section to move the component storing members stored in the unloading waiting sections to the unloading sections and subsequently to move the component storing members stored in the unloading waiting sections to be closer to the unloading sections.

5. The component storing member storage cabinet according to claim 3, wherein the control section is configured to move the component storing members to only some of the unloading sections.

6. A method of managing component storing members in storing sections and unloading sections of a component storing member storage cabinet,
the storing sections storing the component storing members, and
the unloading sections in which the component storing members to be unloaded are disposed,
the method comprising:
- moving the component storing members that are to be unloaded relatively early among the stored component storing members to unloading waiting sections that are some of the storing sections disposed around the unloading sections before receiving an instruction of unloading the component storing members, and
- moving the component storing members stored in the unloading waiting sections to the unloading sections in response to receiving the instruction of unloading the component storing members.

7. A method of managing component storing members in storing sections and unloading sections of a component storing member storage cabinet,
the storing sections storing the component storing members, and
the unloading sections in which the component storing members to be unloaded are disposed, the method comprising:
- a fourth moving step of moving the component storing members that are to be unloaded relatively early among the stored component storing members to the unloading sections before receiving an instruction of unloading the component storing members, and
- moving the component storing members to unloading waiting sections that are some of the storing sections disposed around the unloading sections before receiving the instruction of unloading the component storing members, the component storing members being moved to the unloading waiting sections being to be unloaded early among the component storing members except for the component storing members that are moved to the unloading sections.

8. The component storing member storage cabinet according to claim 4, wherein the control section is configured to move the component storing members to only some of the unloading sections.

* * * * *